United States Patent
Kaneko et al.

[11] Patent Number: 5,890,501
[45] Date of Patent: Apr. 6, 1999

[54] METHOD AND DEVICE FOR DISSOLVING SURFACE LAYER OF SEMICONDUCTOR SUBSTRATE

[75] Inventors: Minako Kaneko; Ayako Shimazaki; Itsuro Ishizaki, all of Yokahama, Japan

[73] Assignee: Kabushiki Kaisha Toshiba, Kawasaki, Japan

[21] Appl. No.: 757,398

[22] Filed: Nov. 27, 1996

[30] Foreign Application Priority Data

Nov. 29, 1995 [JP] Japan ..................................... 7-311050
Oct. 4, 1996 [JP] Japan ..................................... 8-264163

[51] Int. Cl.⁶ ............................. B08B 6/00; H01L 21/302
[52] U.S. Cl. ................................ 134/1.3; 216/90; 216/92; 216/99; 216/57
[58] Field of Search .................. 216/90, 92, 93, 216/99, 100, 104, 107, 57; 134/1.3

[56] References Cited

U.S. PATENT DOCUMENTS 4,749,440 6/1988 Blackwood et al. .................... 156/646
5,167,761 12/1992 Westendors et al. ................... 156/646

OTHER PUBLICATIONS

"Mechanisms of the HF/$H_2O$ Vapor Phase Etching of $SiO_2$";J. Voc. Sci. Tech. A ; 10(4); 8–1992; pp. 806–811; Helms et:al.

*Primary Examiner*—Benjamin Utech
*Assistant Examiner*—George Goudreau
*Attorney, Agent, or Firm*—Finnegan, Henderson, Farabow, Garrett & Dunner, L.L.P.

[57] ABSTRACT

Disclosed is a method of dissolving a surface of a semiconductor substrate or a thin-film surface layer formed on the semiconductor substrate, with an oxidizing agent and fluorine-series gas. The method is characterized in that an initial dissolution rate is controlled by gradually increasing a concentration of fluorine-series gas introduced in a dissolving solution containing the oxidizing agent.

15 Claims, 5 Drawing Sheets

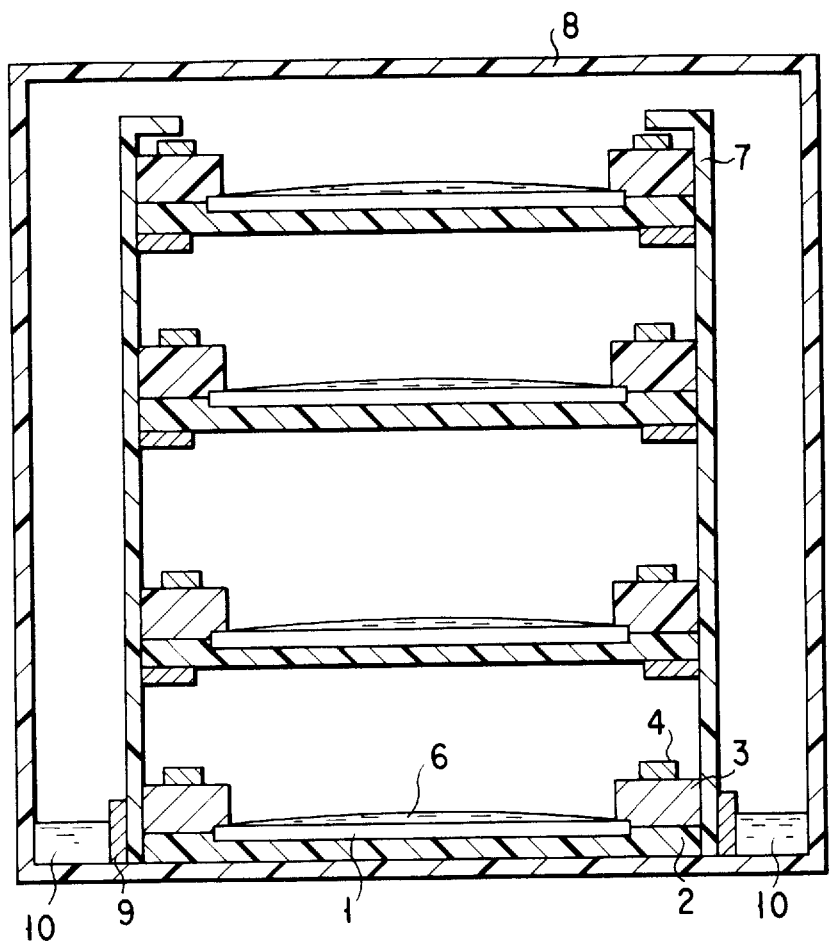
F I G. 1A
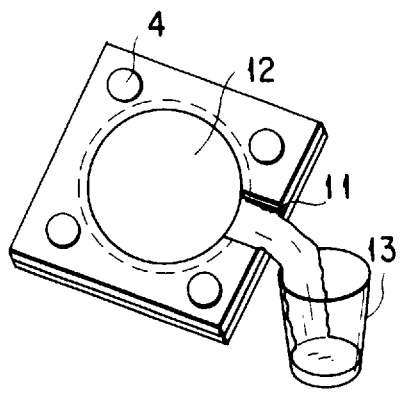
F I G. 1B

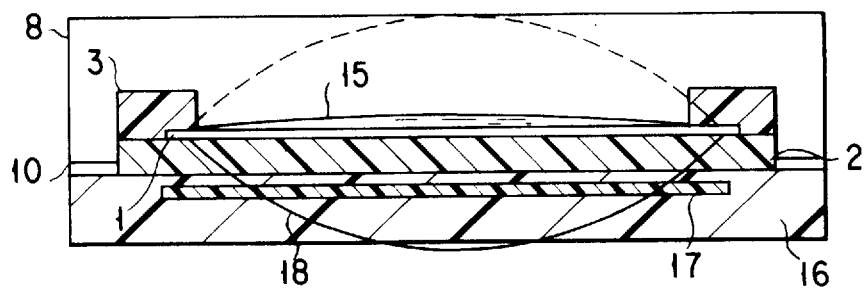
F I G. 5
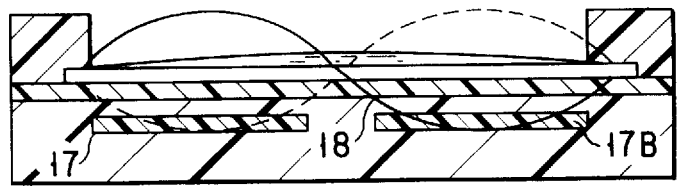
F I G. 6
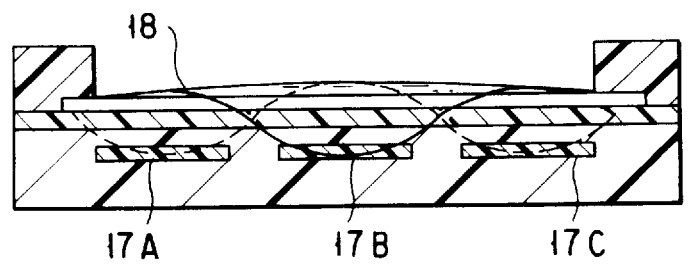
F I G. 7

METHOD AND DEVICE FOR DISSOLVING SURFACE LAYER OF SEMICONDUCTOR SUBSTRATE

BACKGROUND OF THE INVENTION

1. Field of the Invention

The present invention relates to a method and a device for uniformly and slightly dissolving a surface of a semiconductor substrate or a thin-film surface layer, such as a polysilicon film, formed on a semiconductor substrate, (hereinafter collectively referred to as "a semiconductor substrate").

The present invention is effective in analyzing the impurities contained in the surface of a semiconductor substrate and in cleaning the surface of a semiconductor substrate by removing the impurities.

2. Description of the Related Art

If metallic impurities, such as Na, K, and Fe, are present in the semiconductor substrate, even in a small quantities, they have adverse effects on electrical characteristics of semiconductor elements, as is known in the art.

As a semiconductor device is developed toward a highly-dense and highly-integrated one, the presence of the impurities extremely near the surface of the semiconductor substrate becomes a significant problem.

To improve the electrical characteristics of semiconductor elements, it is necessary to prevent contamination with impurities or to remove impurities from the surface of the semiconductor substrate. To achieve this, it is important to know accurate amounts of the impurities contained in the semiconductor substrate and to determine a vertical distribution profile of the impurities near the surface of the semiconductor substrate.

Hitherto, to dissolve the surface layer of the semiconductor substrate, a device shown in FIGS. 3 and 4 has been used. In such a conventionally-used device, a semiconductor substrate 1 is mounted on a fluoroplastic holding stage 2. On the semiconductor substrate 1, a fluoroplastic frame 3 is mounted and fixed watertight by means of screws at the four corners, thereby forming a hole surrounded by the frame 3. Into the hole, a dissolving solution A, which is a mixed solution 5 of hydrofluoric acid and nitric acid, is supplied in a volume needed for dissolving a predetermined amount (a predetermined depth) of the surface layer of the semiconductor substrate. Subsequently, the surface layer is allowed to stand for a predetermined time period while being exposed to the dissolving solution. In this manner, a predetermined region in the surface of the semiconductor substrate is dissolved selectively to a predetermined depth.

The solution dissolving impurities thus obtained is subjected to a flame-less atomic absorption device to measure the amount of the impurities.

In the dissolving solution consisting of nitric acid, which is responsible for oxidization, and hydrofluoric acid, when the concentration of hydrofluoric acid is high, a dissolution rate of the surface layer is controlled by nitric acid. In contrast, when the concentration of nitric acid is high, hydrofluoric acid determines the dissolution rate.

To be more specific, when nitric acid is diluted with acetic acid or water, nitric acid is activated. Therefore, the oxidation reaction of nitric acid controls the dissolution rate. If no diluent is added, the dissolution is controlled only by diffusion of hydrofluoric acid.

In short, in the case where the concentration of nitric acid is high, the dissolution rate of the surface of the semiconductor substrate is preferentially regulated by the diffusion of hydrofluoric acid contained in a low amount. The crystal orientation and electrical conductivity of the semiconductor substrate do not influence the dissolution rate of the surface of the semiconductor substrate. Hence, it is important to stir the dissolving solution.

However, there are the following problems with the conventional methods.

First, since the dissolving solution is directly supplied to the surface of the semiconductor substrate present at the bottom of the hole surrounded by the frame in a volume enough to dissolve a predetermined amount (predetermined depth) of the semiconductor substrate, the semiconductor substrate exposed first to the dissolving solution initiates the reaction with the dissolving solution, immediately upon exposure, as indicated by curve a shown in FIG. 2. The portion first exposed to the dissolving solution is therefore dissolved much (dissolved deeper) than the portion finally exposed to the dissolving solution. As a result, the surface of the wafer is dissolved not uniformly in depth, forming a rough surface.

Second, since the dissolving solution is supplied to the hole in as a low volume as possible, approximately 3 seconds is required to spread the dissolving solution over the entire surface of a semiconductor substrate if a 6-inch semiconductor substrate is used. As a result, if the dissolving solution is supplied at the same flow rate, longer time is required for spreading the solution over the entire surface of the semiconductor substrate as the diameter of the substrate increases.

Third, if a diluent, such as acetic acid, is added to the dissolving solution, the dissolving solution is contaminated with impurities ascribed to the diluent, with the result that the impurity concentration of the background is undesirably increased.

Fourth, when nitric acid and hydrofluoric acid is mixed uniformly and sufficiently with stirring manually or mechanically, there is a problem in that the dissolving solution is easily splashed out of the hole, even if the dissolving solution is used in as a low volume as possible.

In addition, when a stirrer is used as mechanical stirring means, the dissolving solution is possibly contaminated with impurities due to the stirrer. Consequently, the background is contaminated with impurities.

The background impurity contamination occurs also when the entire surface of the semiconductor substrate is dissolved, since the dissolving solution is kept by means of a holding tool consisting of a frame, holding stage and screws. Accordingly, the contamination ascribed to the holding tool is caused since it is exposed to the dissolving solution all the time.

SUMMARY OF THE INVENTION

The present invention has been made with the view toward solving the aforementioned problems. An object of the present invention is to provide a method and a device capable of dissolving the surface of the semiconductor substrate or a thin-film surface layer, such as a polysilicon film, formed on a semiconductor substrate, slightly, uniformly and accurately.

According to a first aspect of the present invention, there is provided a method for dissolving a surface of a semiconductor substrate or a thin-film surface layer formed on the a semiconductor substrate by use of a fluorine-series gas (hereinafter, gas includes vapor) and an oxidizing agent. In this method, an initial dissolution rate is controlled by gradually increasing a concentration of the fluorine-series gas in a dissolving solution containing an oxidizing agent.

In the aforementioned method according to the first aspect of the present invention, the surface of the semiconductor substrate or the thin-film surface layer formed on the semiconductor substrate is placed in a dissolving solution containing an oxidizing agent, and exposed to the fluorine-series gas to gradually increase the concentration of the fluorine-series gas to be dispersed in the dissolving solution containing an oxidizing agent, thereby controlling the initial dissolution rate.

In the aforementioned method according to the first aspect of the present invention, a dissolving solution containing an oxidizing agent solution is placed on part of the surface of the semiconductor substrate or the thin-film surface layer formed on the semiconductor substrate, and exposed to the fluorine-series gas to gradually increase the concentration of the fluorine-series gas to be dispersed in the dissolving solution containing an oxidizing agent solution, thereby controlling an initial dissolution rate of the part.

In the aforementioned method according to the first aspect of the present invention, a dissolving solution containing an oxidizing agent solution is supplied to part or an entire surface of the semiconductor substrate or the thin-film surface layer within a frame immobilized on the surface of the semiconductor substrate or the thin-film surface layer formed on the semiconductor substrate, and exposed to the fluorine-series gas to gradually increase the concentration of the fluorine-series gas to be dispersed in the dissolving solution containing an oxidizing agent solution, thereby controlling an initial dissolution rate of the part or the entire surface of the semiconductor substrate or the thin-film surface layer within the frame immobilized.

In the aforementioned method according to the first aspect of the present invention, as the fluorine-series gas, hydrofluoric acid or ammonium fluoride may be used.

In the aforementioned method, as the oxidizing agent, use may be made of nitric acid, a nitric acid solution containing a diluent selected from the group consisting of acetic acid, water, hydrogen, and bromine; hydrogen peroxide; and ammonium fluoride.

In the aforementioned method, as the surface of the semiconductor substrate or the thin-film surface layer formed on a semiconductor substrate to be dissolved, use may be made of a single-crystalline silicon, polycrystalline silicon, amorphous silicon; a single crystalline silicon, polycrystalline silicon, and amorphous silicon, each containing any one of the group consisting of bromine, phosphorus, and arsenic; and a metal-tungsten silicon (WSI) alloy, a metal-molybdenum silicon (MoSi) alloy, a metal-aluminium silicon copper (AlSiCu) alloy, and a metal-titanium silicon (TiSi) alloy.

In the aforementioned method, the initial dissolution rate is larger than 0.02 nm/min and lower than 2 nm/min.

According to a second aspect of the present invention, there is provided a device for use in dissolving a surface of a semiconductor substrate or a thin-film surface layer formed on a semiconductor substrate, comprising:

a holding stage for mounting a semiconductor substrate thereon, a frame having a discharge port, to be provided on the semiconductor substrate, a rack, and an airtight chamber for housing the rack 7, in which the holding stage and the frame are immobilized with screws to form a hole surrounded by the frame; the rack houses the semiconductor substrate formed on the holding stage having a hole filled with nitric acid; and the airtight chamber has a groove containing a hydrofluoric acid solution at the bottom.

According to a third aspect of the present invention, there is provided a method of dissolving an entire surface of a semiconductor substrate or a thin surface layer formed on a semiconductor substrate, comprising the steps of:

placing a semiconductor substrate on a holding stage and fixing watertight the semiconductor substrate with a frame;

housing the semiconductor substrate fixed with frame thus obtained in an airtight chamber containing hydrofluoric acid;

placing the airtight chamber housing the semiconductor substrate, on an acoustic wave generating portion;

supplying an oxidizing agent serving as a dissolving solution dropwise so as to cover the surface of the semiconductor substrate and closing the airtight chamber; and transmitting vibrating waves having a perpendicular component to the semiconductor substrate from a vibrator provided to the acoustic wave generating portion, thereby stirring the oxidizing agent.

According to a fourth aspect of the present invention, there is provided a method of dissolving an entire surface of a semiconductor substrate or a thin-surface layer formed on a semiconductor substrate, comprising the steps of:

placing a semiconductor substrate on a holding stage and fixing the semiconductor substrate watertight with a frame;

housing the semiconductor substrate fixed with frame thus obtained in an airtight chamber containing hydrofluoric acid;

placing the airtight chamber housing the semiconductor substrate, on an acoustic wave generating portion having a plurality of vibrators;

supplying an oxidizing agent serving as a dissolving solution so as to cover the surface of the semiconductor substrate and closing the airtight chamber; and transmitting vibrating waves having a perpendicular component to the semiconductor substrate from the plural vibrators, thereby stirring the oxidizing agent.

According to a fifth aspect of the present invention, there is provided a method of dissolving a predetermined region in a surface of a semiconductor substrate or a thin-surface layer formed on a semiconductor substrate, comprising the steps of:

placing a semiconductor substrate on a holding stage;

housing the semiconductor substrate with the holding stage in an airtight chamber containing hydrofluoric acid;

placing the airtight chamber housing the semiconductor substrate, on an acoustic wave generating portion having at least two vibrators;

transmitting vibrating waves having a perpendicular component to the semiconductor substrate from the at least two vibrators to the semiconductor substrate to determine a node, an intersection of standing waves;

corresponding the predetermined region of the semiconductor substrate to the node;

supplying an oxidizing agent serving as a dissolving solution dropwise to the predetermined region of the semiconductor substrate; and dissolving the predetermined region of the semiconductor substrate with stirring while the oxidizing agent is being collected and retained at a node by use of vibrating waves.

According to a sixth aspect of the present invention, there is provided a method of dissolving a plurality of predetermined regions in a surface of a semiconductor substrate or a thin surface layer formed on a semiconductor substrate, comprising the steps of:

placing a semiconductor substrate on a holding stage;

housing the semiconductor substrate with the holding stage in an airtight chamber containing hydrofluoric acid;

placing the airtight chamber housing the semiconductor substrate, on an acoustic wave generating portion having at least two vibrators;

transmitting vibrating waves having a perpendicular component to the semiconductor substrate from the at least two vibrators to the semiconductor substrate to determine a plurality of nodes, intersections of standing waves;

corresponding the plural predetermined regions in a surface of the semiconductor substrate to the plural nodes; and supplying an oxidizing agent serving as a dissolving solution dropwise to the plural predetermined regions in a surface of the semiconductor substrate.

According to a seventh aspect of the present invention, there is provided a method of dissolving a predetermined region of a semiconductor substrate or a thin surface layer formed on a semiconductor substrate, comprising the steps of:

placing a semiconductor substrate on a holding stage;

housing the semiconductor substrate with the holding stage in an airtight chamber containing hydrofluoric acid;

providing an acoustic wave generating portion having at least two vibrators to the upper portion of the airtight chamber housing the semiconductor substrate;

placing the at least two vibrators so as to surround the predetermined region of the semiconductor substrate; and dissolving the predetermined region of the semiconductor substrate with stirring while the dissolving solution is being collected and retained at a node by transmitting vibrating waves through the atmosphere in the airtight chamber.

In the methods according to the third to seventh aspects, the vibrator acoustic wave generating portion generates acoustic waves having a frequency of 1 KHz to 1 MHz.

According to an eighth aspect of the present invention, there is provided a device for dissolving a surface of a semiconductor substrate or a thin surface layer formed on a semiconductor substrate, comprising a holding stage for mounting a semiconductor substrate thereon;

a frame for immobilizing the semiconductor substrate on a holding stage watertight by means of screws at the four corners to form a hole surrounded by the frame;

an airtight chamber containing hydrofluoric acid;

an acoustic wave generating portion having one or a plurality of vibrators; and means for supplying a dissolving solution dropwise;

in which the semiconductor substrate is dissolved by stirring with acoustic waves generated from the one or plural vibrators.

According to a ninth aspect of the present invention, there is provided a device for dissolving a predetermined region in a surface of a semiconductor substrate or a thin surface layer formed on a semiconductor substrate, comprising a holding stage for mounting a semiconductor substrate;

an airtight chamber containing hydrofluoric acid;

an acoustic wave generating portion having one or a plurality of vibrators; and means for supplying a dissolving solution dropwise;

in which the semiconductor substrate is dissolved by stirring with acoustic waves generated from the one or plural vibrators.

In the devices according to the eighth and ninth aspects, the one or plural vibrators of the acoustic wave generating portion generate acoustic waves having a frequency 1 KHz to 1 MHz and the vibrating waves have a parallel component, a perpendicular component, or both parallel and perpendicular components.

To summarize, the methods and devices according to the third aspect to ninth aspect, the semiconductor substrate is dissolved by stirring the dissolving solution spread on the semiconductor substrate by transmitting acoustic waves thereto without using any stirring means in contact with the solution.

In the case where the entire portion of a surface of the semiconductor substrate is dissolved, acoustic waves having a parallel component and perpendicular component to the substrate are transmitted from a vibrator to stir the dissolving solution.

In the case where a predetermined region in a surface of the semiconductor substrate is partially dissolved, acoustic waves having a perpendicular component to the substrate are first transmitted to the substrate from a plurality of vibrators to determine intersections of waves, namely nodes, followed by supplying a dissolving solution to the nodes. In this way, the dissolution is carried out while the dissolving solution is retained at the predetermined region corresponding to the nodes and stirred by use of the vibration waves.

The present invention thus constituted has the following advantages.

First, a surface layer of a semiconductor substrate or a thin-film surface layer, such as a polysilicon film, formed on a semiconductor substrate can be dissolved uniformly to the depth of several tens of angstroms with an accuracy of ±3%, by use of a nitric acid solution to which a fluorine-series gas is uniformly diffused.

Second, the contamination ascribed to environment can be prevented since the semiconductor substrate is dissolved in an airtight chamber.

The dissolving solution of nitric acid and hydrofluoric acid (contained in a low amount) can be stirred without splash since the stirring is performed by use of acoustic waves, Since the dissolving solution is stirred by acoustic waves transmitted to the semiconductor substrate from the rear side thereof, without using any stirring means exposed to the dissolving solution, the impurity contamination due to stirring means in the background of the dissolving solution, can be reduced.

Furthermore, in the case where the semiconductor substrate is partially dissolved, since the dissolving solution can be retained at a predetermined region by acoustic waves but not by a retaining member, contamination ascribed to the retaining member is inhibited.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1A is a schematic cross sectional view of a device according to Embodiment 1 of the present invention;

FIG. 1B is a plan view of the construct formed of a semiconductor substrate and a frame immobilized on the substrate with screws;

FIG. 5 is a cross sectional view of the device according to Embodiments 2 and 3 of the present invention;

FIG. 6 is a cross sectional view (1) of the device according to Embodiment 4;

FIG. 7 is a cross sectional view (2) of the device according to Embodiment 4;

DETAILED DESCRIPTION OF THE PREFERRED EMBODIMENTS

Hereinbelow, preferred embodiments will be explained with reference to the accompanying drawings.
(Embodiment 1)

Figure 2:
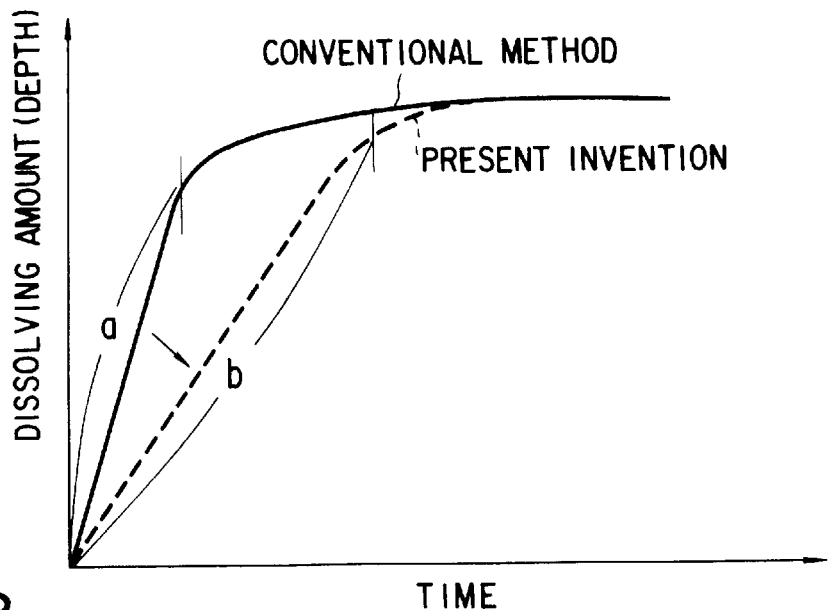
FIG. 2 is a graph showing the relationship between the dissolving amount per time by comparing a method according to Embodiment 1 of the present invention and a conventional method.

The device according to Embodiment 1 of the present invention is shown in FIGS. 1A and 2.

FIG. 1A is a schematic cross sectional view of a device according to Embodiment 1 of the present invention. FIG. 2 is a graph showing the relationship between the dissolving amount per time by comparing a method according to Embodiment 1 of the present invention and a conventional method.

In Embodiment 1, explained is a method of dissolving 5-inch diameter portion of a 6-inch diameter semiconductor substrate to several tens of angstroms in depth.

In the first place, a semiconductor substrate 1 is mounted on a fluoroplastic holding stage 2. On the semiconductor substrate 1, a fluoroplastic frame 3 is mounted and immobilized watertight by means of screws 4 at the four corners to form a hole surrounded by the frame 3. In the hole, a nitric acid solution 6 (68%) serving as an oxidizing agent is supplied in as a low volume as possible (5–10 ml). Incidentally, if an 8-inch diameter semiconductor substrate is used, 10–15 ml of the nitric acid solution should be supplied. The resultant construct is placed in a rack 7.

The rack 7 with the construct is housed in an airtight chamber 8 containing hydrofluoric acid 10 in a groove provided at the bottom. After closed airtight, the airtight chamber 8 is allowed to stand for about 3–5 minutes. During this period, a fluorine-series gas is diffused within the nitric acid solution in a concentration of several tens of ppm and then the surface of the semiconductor substrate 1 is dissolved in a thickness of several tens of angstroms.

Thereafter, the rack 7 with the construct is taken out of the airtight chamber 8, in its entirety. Subsequently, the construct shown in FIG. 1B is taken out. After the dissolving solution 12 is discharged by way of a discharging port, the semiconductor substrate 1 with the frame is washed with water.

Figure 3:
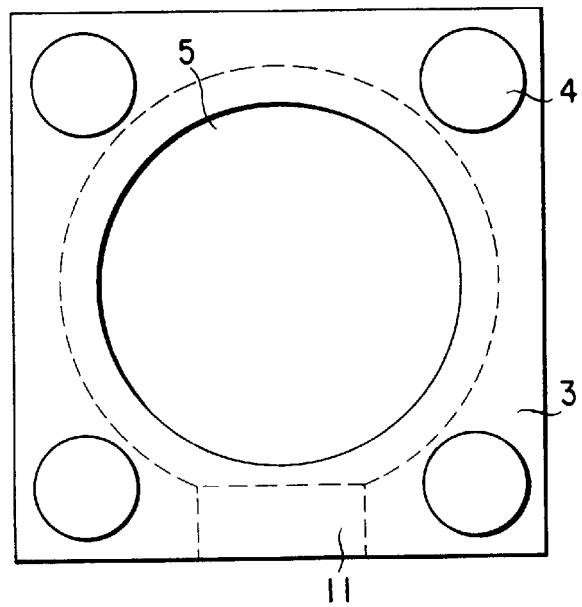
FIG. 3 is a plan view of a conventional device.
Figure 4:
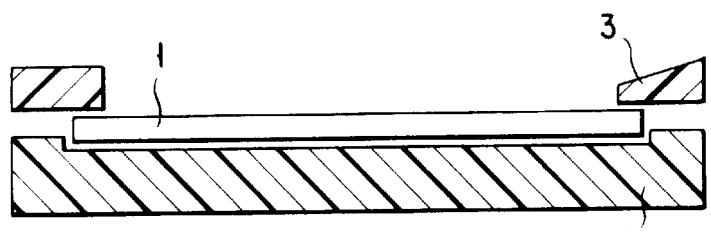
FIG. 4 is a schematic cross-sectional view of a conventional device.

In the method of the present invention, first, the nitric acid solution is supplied dropwise to the hole in a minimum volume required for being spread slightly over the entire surface of the semiconductor substrate at the bottom of the hole. Subsequently, the nitric acid solution spread over the substrate is exposed to a fluorine-series gas. Consequently, the concentration of fluorine-series gas is gradually and increasingly diffused into the nitric acid solution, thereby controlling the initial dissolution rate of the semiconductor substrate as indicated by a curve b shown in FIG. 3. In this way, the surface of the semiconductor substrate can be uniformly and slightly dissolved.

Therefore, the present invention made it possible to dissolve the semiconductor surface uniformly and slightly, thereby attaining the dissolution accurately.

As the fluorine-series gas used herein, hydrofluoric acid or ammonium fluoride may be used.

As the oxidizing agent, use may be made of nitric acid; a nitric acid solution containing acetic acid, water, hydrogen, or bromine, as a diluent; hydrogen peroxide; or ammonium fluoride.

The oxidizing agent is prepared in advance by mixing the nitric acid solution (68%) and the diluent in the dilution rate of 5:1 to 5:3 by volume. To be more specific, when 5–10 ml of the nitric acid solution is used, a diluent, for example, acetic acid, may be added in a volume of 1 ml to 6 ml in accordance with the aforementioned dilution rate.

The surface layers to be dissolved by the oxidizing agent in combination with a fluorine-series gas include a single crystalline silicon, polycrystalline silicon, and amorphous silicon; single crystalline silicon, polycrystalline silicon, and amorphous silicon containing any one of boron, phosphorus, and arsenic; alloys such as a metal-tungsten silicon (WSi) alloy, a metal-molybdenum silicon (MoSi) alloy, a metal-aluminium silicon copper (AlSiCu) alloy, and a metal-titanium silicon (TiSi) alloy.

In this method, the initial dissolution rate should be a value larger than 0.02 nm/min and smaller than 2 nm/min.

The amount of impurities is determined by collecting the dissolving solution 12 in a previously-washed fluoroplastic beaker 13 and then analyzing by a flame-less atomic absorption device directly or after appropriately concentrated to a desired volume.

After the semiconductor substrate is washed with water and dried, the aforementioned procedure is repeated for predetermined times, starting from the supply of a nitric acid solution 6 (68%) to the hole. In this way, the vertical impurity distribution profile of the semiconductor substrate can be determined.

Nitric acid and acetic acid used herein must have an impurity concentration of 10 ppt or less. The hydrofluoric acid solution to be used herein must have an impurity concentration of 10 ppb or less.

As the tool for immobilizing the semiconductor substrate such as a frame, holding stage, and screws, use may be made of fluoroplastic such as poly-tetra fluoroethylene.

The same method can be used for dissolving a thin film surface layer, such as a polysilicon film, formed on the semiconductor substrate.

(Embodiment 2 to Embodiment 9)

Embodiments 2 to 9 of the present invention relate to methods and devices for dissolving the surface of the semiconductor substrate entirely or partially while an oxidizing agent is being stirred with vibrating waves.

The vibrating waves are generated from one or a plurality of vibrators provided at the portion above or beneath a semiconductor substrate.

In the entire surface portion of the semiconductor substrate is dissolved, the stirring may be performed by use of vibrating waves having either a perpendicular component or a parallel component to the substrate, generated from one vibrator. Alternatively, the stirring may be performed by vibrating waves, generated from a plurality of vibrators which are arranged so as not to generate nodes of standing waves, or by vibrating waves having a parallel component, generated from a plurality of vibrators.

Predetermined portions in a surface of the semiconductor substrate are partially dissolved with the oxidizing agent is being collected and retained at the positions on the semiconductor substrate corresponding to nodes of standing waves by stirring.

(Embodiment 2)

A cross sectional view of the device according to Embodiment 2 of the present invention is shown in FIG. 5.

The device comprises an acoustic wave generating portion 16 having one or a plurality of vibrators 17;

an airtight chamber 8 to which hydrofluoric acid 10 can be introduced;

a holding stage 2 for mounting a semiconductor substrate 1 to be examined;

a frame 3 for use in dissolving the entire surface of the substrate 1; and means for supplying the dissolving solution.

The holding stage 2 and the frame 3 are immobilized to each other. A dissolving solution is stirred by acoustic waves generated from one or a plurality of vibrators.

By virtue of the aforementioned structure, the device is effective in dissolving the surface of the semiconductor substrate slightly, uniformly and accurately.

(Embodiment 3)

Embodiment 3 of the present invention will be explained with reference to a cross sectional view of the device shown in FIG. 5.

The method of Embodiment 3 for dissolving the entire surface of a semiconductor substrate comprises the steps of:

mounting the semiconductor substrate 1 on the holding stage 2;

immobilizing the frame 3 watertight on the semiconductor substrate 1 by means of screws 4 at the four corners to form a hole surrounded by the frame 3;

placing the semiconductor substrate 1 with the frame 3 in the airtight chamber 8 containing hydrofluoric acid 10;

mounting the airtight chamber 8 on an acoustic wave generating portion 16;

supplying an oxidizing agent 15 in a volume (5 to 10 ml) enough to cover the entire surface of the semiconductor substrate 1 and closing the airtight chamber 8 airtight;

transmitting vibrating waves 30 having a perpendicular component to the substrate from a vibrator 17 provided to the acoustic wave generating portion 16 to the substrate 1;

stirring the oxidizing agent 15 by transmitting the vibrating waves to the substrate 1;

allowing hydrofluoric acid vapor to diffuse into the oxidizing agent 15 gradually and uniformly to about several tens of ppm while the oxidizing agent 15 is being stirred for about 3–5 minutes, with the result that the surface layer of the substrate is dissolved in a thickness of several tens of angstroms, terminating the generation of waves from the acoustic wave generating portion;

opening the airtight chamber 8, taking out the semiconductor substrate immobilized with the frame, discharging the solution containing impurities, and washing the semiconductor substrate immobilized with the frame, with water, collecting the solution containing impurities in a cleaned fluoroplastic beaker for quantitative determination of impurities, concentrating the solution thus collected to a desired volume, and determining an impurity concentration by means of a flame-less atomic absorption device or the like.

(Embodiment 4)

Cross sectional views of the device according to Embodiment 4 are shown in FIGS. 6 and 7.

Referring to FIGS. 6 and 7, we will explain a method of dissolving the entire surface of a semiconductor substrate to be examined by use of acoustic waves generated by using the device of Embodiment 4.

The method comprises the steps of:

placing the airtight chamber 8 housing a semiconductor substrate 1 on a wave generating portion 16 having a plurality of vibrators; and transmitting vibrating waves 30 having a perpendicular component to the substrate to the semiconductor substrate 1 from a vibrator 17, thereby stirring a dissolving solution.

The vibrator used herein can generate waves having a frequency of 1 KHz to 1 MHz.

The holding stage 2 is coated with teflon to prevent corrosion.

(Embodiment 5)

Figure 8:
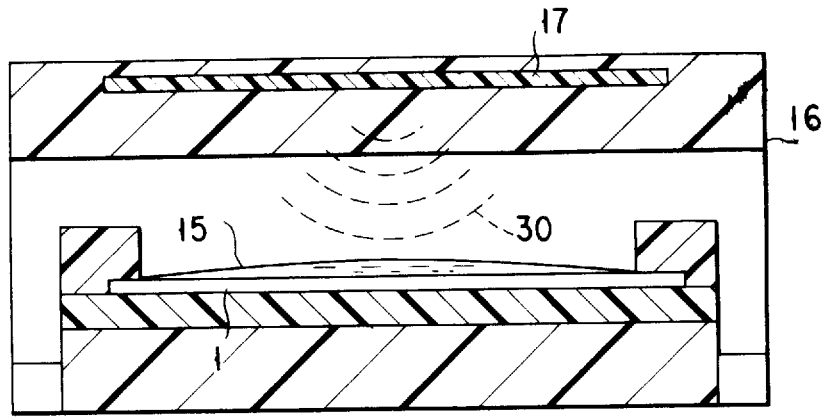
FIG. 8 is a cross sectional view (1) of the device according to Embodiment 5.
Figure 9:
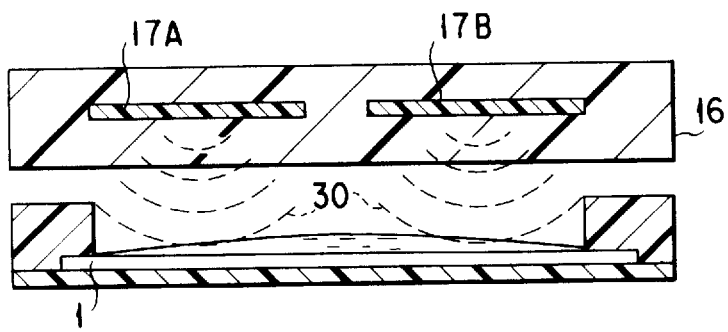
FIG. 9 is a cross sectional view (2) of the device according to Embodiment 5.
Figure 10:
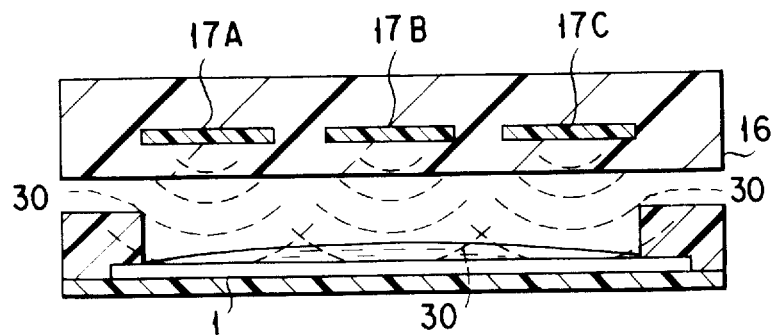
FIG. 10 is a cross sectional view (3) of the device according to Embodiment 5.

Cross sectional views of the device according to Embodiment 5 are shown in FIGS. 8 to 10.

Referring to FIGS. 8 to 10, we will explain a method of dissolving the entire surface of a semiconductor substrate to be examined by use of acoustic waves generated by using the device of embodiment 5.

The method comprises the steps of:

setting an acoustic wave generating portion 16 having one or a plurality of vibrators at the upper portion of the airtight chamber 8 housing a semiconductor substrate 1; and transmitting vibrating waves having a perpendicular component to the substrate from the vibrator through the atmosphere of the airtight chamber, thereby stirring a dissolving solution.

(Embodiment 6)

Figure 11:
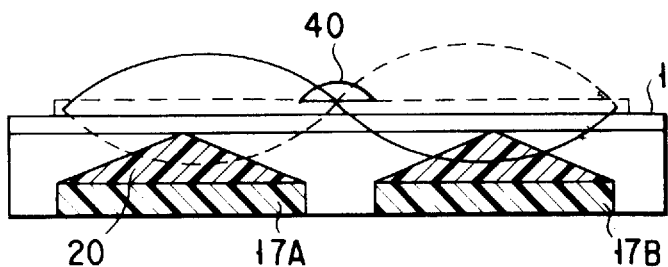
FIG. 11 is a cross sectional view of the device according to Embodiment 6.

A cross sectional view of the device according to Embodiment 6 is shown in FIG. 11.

Referring to FIG. 6, we will explain a method of partially dissolving a predetermined region of the surfaced of a semiconductor device, by use of vibrating waves generated by using the device of Embodiment 6.

The method comprises the steps of:

setting a substrate to be examined on a holding stage;

placing the substrate set with the holding stage in an airtight chamber containing hydrofluoric acid;

mounting the airtight chamber on an acoustic wave generating portion having two vibrators;

transmitting vibration waves having a perpendicular component to the semiconductor substrate directly from the vibrators;

corresponding a predetermined dissolution portion to a node 40, which is an intersection of standing waves;

supplying an oxidizing agent dropwise to the predetermined dissolving portion of the substrate by means of a micropipet or the like; and dissolving the semiconductor substrate while the oxidizing agent is being collected and retained at the node by stirring with vibration waves.

(Embodiment 7)

Figure 12:
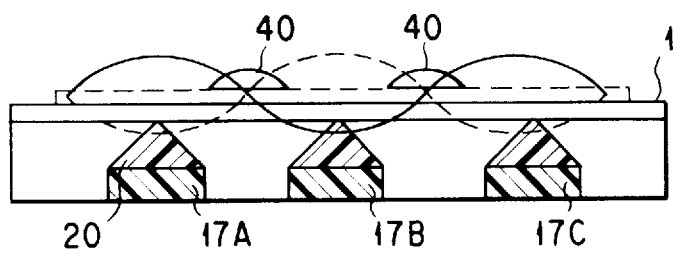
FIG. 12 is a cross sectional view of the device according to Embodiment 7.

A cross sectional view of the device according to Embodiment 7 is shown in FIG. 12.

Referring to FIG. 12, we will explain a method of partially dissolving a predetermined region in the surface of the semiconductor substrate, by use of acoustic waves generated by using the device of Embodiment 7.

The method comprises the steps-of:

mounting an airtight chamber housing a semiconductor substrate to be examined on an acoustic wave generating portion having three vibrators;

transmitting vibrating waves having a perpendicular component to the semiconductor substrate from the vibrators to determine a plurality of nodes 40 of the standing waves.

(Embodiment 8)

Figure 13:
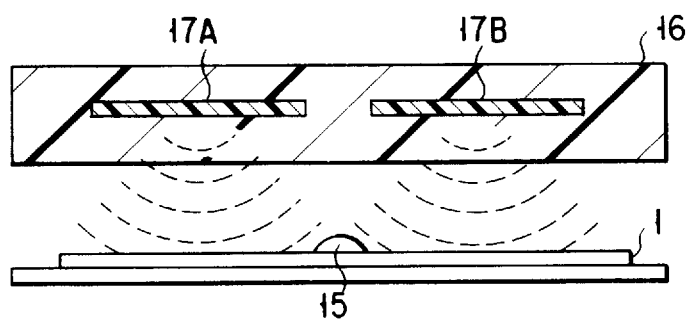
FIG. 13 is a cross sectional view of the device according to Embodiment 8.

A cross sectional view of the device according to Embodiment 8 is shown in FIG. 13.

Referring to FIG. 13, we will explain a method of partially dissolving a predetermined region in the surface of the semiconductor substrate by use of acoustic waves generated by using the device of Embodiment 8.

The method comprises the steps of:

providing an acoustic wave generating portion having two vibrators at the upper portion of the airtight chamber housing a substrate so as to surround a predetermined region to be dissolved on the substrate; and dissolving the predetermined region of the substrate while the dissolving solution is being collected and retained at the predetermined region by transmitting the vibrating waves through an atmosphere in the airtight chamber.

(Embodiment 9)

Figure 14:
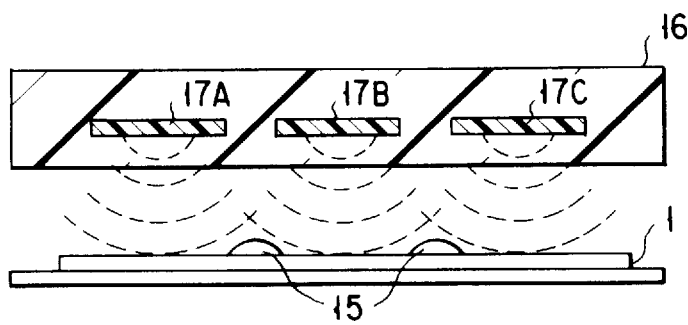
FIG. 14 a cross sectional view of the device according to Embodiment 9.

A cross sectional view of the device according to Embodiment 9 is shown in FIG. 14.

Referring to FIG. 14, we will explain a method of partially dissolving a predetermined region in the surface of the semiconductor substrate by use of acoustic waves generated by using the device of Embodiment 9.

providing an acoustic wave generating portion having three vibrators at the upper portion of the airtight chamber housing a substrate so as to surround predetermined dissolving portions on the substrate; and dissolving the predetermined regions of the substrate while the dissolving solution is being collected and retained at the predetermined regions by transmitting the vibrating waves through an atmosphere in the airtight chamber.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for dissolving a surface of a semiconductor substrate or a thin-film surface layer formed on the semiconductor substrate by use of a fluorine-series gas and an oxidizing agent, the method comprising:

controlling an initial dissolution rate of the surface of the semiconductor substrate or the thin-film surface layer formed on the semiconductor substrate by gradually increasing the concentration of said fluorine-series gas in a dissolving solution to several tens of parts per million (ppm) by diffusing said gas for approximately 3 to 5 minutes in the dissolving solution on the surface of the semiconductor substrate or the thin-film surface layer formed on the semiconductor substrate containing an oxidizing agent.

2. The method according to claim 1, wherein said surface of a semiconductor substrate or said thin-film surface layer formed on the semiconductor substrate is placed in a dissolving solution containing an oxidizing agent, and exposed to said fluorine-series gas to gradually increase a concentration of the fluorine-series gas to be dispersed in said dissolving solution containing an oxidizing agent, thereby controlling said initial dissolution rate.

3. The method according to claim 1, wherein a dissolving solution containing an oxidizing agent is placed on part of said surface of a semiconductor substrate or a thin-film surface layer formed on the semiconductor substrate and exposed to said fluorine series gas to gradually increase a concentration of said fluorine-series gas to be dispersed in said dissolving solution containing an oxidizing agent, thereby controlling an initial dissolution rate of said part.

4. The method according to claim 1, wherein a dissolving solution containing an oxidizing agent is supplied to part or an entire surface of the semiconductor substrate or the thin-film surface layer within a frame immobilized on said surface of the semiconductor substrate or said thin-film surface layer formed on the semiconductor substrate, and then exposed to said fluorine-series gas to gradually increase a concentration of said fluorine-series gas to be dispersed in said dissolving solution containing an oxidizing agent, thereby controlling an initial dissolution rate of said part or said entire surface of a semiconductor substrate or said thin-film surface layer within said frame immobilized.

5. The method according to any one of claims 1 to 4, wherein said fluorine-series gas is one selected from the group consisting of hydrofluoric acid and ammonium fluoride.

6. The method according to any one of claims 1 to 4, wherein said oxidizing agent is selected from the group consisting of nitric acid; a nitric acid solution containing a diluent selected from the group consisting of acetic acid, water, hydrogen, and bromine; hydrogen peroxide; and ammonium fluoride.

7. The method according to any one of claims 1 to 4, wherein said surface of a semiconductor substrate or said thin-film surface layer formed on the semiconductor substrate is one selected from the group consisting of a single-crystalline silicon, a poly-crystalline silicon, an amorphous silicon a metal-tungsten silicon (WSI) alloy, a metal-molybdenum silicon (MoSi) alloy, a metal-aluminum silicon copper (AlSiCu) alloy, and a metal-titanium silicon (TiSi) alloy, wherein the single-crystalline silicon, the poly-crystalline silicon, and the amorphous silicon each contain any one of the group consisting of bromine, phosphorus, and arsenic.

8. The method according to any one of claims 1 to 4, wherein said initial dissolution rate is larger than 0.02 nm/min and lower than 2 nm/min.

9. A method of dissolving an entire surface of a semiconductor substrate or a thin surface layer formed on the semiconductor substrate, comprising the steps of:

placing a semiconductor substrate on a holding stage and fixing said semiconductor substrate watertight with a frame;

housing said semiconductor substrate fixed with frame thus obtained in an airtight chamber containing hydrofluoric acid;

placing said airtight chamber housing said semiconductor substrate, on an acoustic wave generating portion consisting of one vibrator;

supplying an oxidizing agent serving as a dissolving solution dropwise in a minimum volume required to cover the surface of said semiconductor substrate and closing said airtight chamber; and transmitting vibrating waves having a perpendicular component to said semiconductor substrate from a vibrator provided to said acoustic wave generating portion, thereby stirring said oxidizing agent.

10. A method of dissolving an entire surface of a semiconductor substrate or of a thin-surface layer formed on the semiconductor substrate, comprising the steps of:

placing a semiconductor substrate on a holding stage and fixing said semiconductor substrate watertight with a frame;

housing said semiconductor substrate fixed with frame thus obtained in an airtight chamber containing hydrofluoric acid;

placing said airtight chamber housing said semiconductor substrate, on an acoustic wave generating portion having a plurality of vibrators;

supplying an oxidizing agent serving as a dissolving solution so as to cover the surface of said semiconductor substrate and closing said airtight chamber; and transmitting vibrating waves having a perpendicular component to said semiconductor substrate from said plural vibrators, thereby stirring said oxidizing agent.

11. A method of dissolving a predetermined region in a surface of a semiconductor substrate or of a thin-surface layer formed on the semiconductor substrate, comprising the steps of:

placing a semiconductor substrate on a holding stage;

housing said semiconductor substrate with said holding stage in an airtight chamber containing hydrofluoric acid;

placing said airtight chamber housing said semiconductor substrate, on an acoustic wave generating portion having at least two vibrators;

transmitting vibrating waves having a perpendicular component to said semiconductor substrate from said at least two vibrators to said semiconductor substrate to determine a node, an intersection of standing waves;

corresponding said predetermined region of said semiconductor substrate to said node;

supplying an oxidizing agent serving as a dissolving solution dropwise to said predetermined region of said semiconductor substrate; and dissolving said predetermined region of said semiconductor substrate with stirring while said oxidizing agent is being collected and retained at said node by use of vibrating waves.

12. A method of dissolving a plurality of predetermined regions in a surface of a semiconductor substrate or a thin surface layer formed on the semiconductor substrate, comprising the steps of:

placing a semiconductor substrate on a holding stage;

housing said semiconductor substrate with said holding stage in an airtight chamber containing hydrofluoric acid;

placing said airtight chamber housing said semiconductor substrate, on an acoustic wave generating portion having at least two vibrators;

transmitting vibrating waves having a perpendicular component to said semiconductor substrate from said at least two vibrators to said semiconductor substrate to determine a plurality of nodes, intersections of standing waves;

corresponding said plural predetermined regions in a surface of said semiconductor substrate to said plural nodes; and supplying an oxidizing agent serving as a dissolving solution dropwise to said plural predetermined regions in a surface of said semiconductor substrate.

13. A method of dissolving a predetermined region of a semiconductor substrate or a thin surface layer formed on the semiconductor substrate, comprising the steps of:

placing a semiconductor substrate on a holding stage;

housing said semiconductor substrate with said holding stage in an airtight chamber containing hydrofluoric acid;

providing an acoustic wave generating portion having at least two vibrators to the upper portion of said airtight chamber housing said semiconductor substrate;

placing said at least two vibrators so as to surround a predetermined region of said semiconductor substrate; and dissolving said predetermined region of said semiconductor substrate with stirring while said dissolving solution is being collected and retained at a node by transmitting vibrating waves through the atmosphere in said airtight chamber.

14. The methods according to any one of claims 9 to 13, wherein said vibrator acoustic wave generating portion generates acoustic waves having a frequency of 1 KHz to 1 MHz.

15. A method for dissolving a surface of a semiconductor substrate or a thin-film surface layer formed on the semiconductor substrate by use of a fluorine-series gas and an oxidizing agent, the method comprising:

controlling an initial dissolution rate of the surface of the semiconductor substrate or the thin-film surface layer formed on the semiconductor substrate by gradually increasing the concentration of the fluorine-series gas in a dissolving solution containing the oxidizing agent on the surface of the semiconductor substrate or the thin-film surface layer formed on the semiconductor substrate, wherein the oxidizing agent is selected from the group consisting of nitric acid; a nitric acid solution containing a diluent selected from the group consisting of acetic acid, water, hydrogen and bromine; hydrogen peroxide; and ammonium fluoride.

* * * * *